United States Patent
Berry, III et al.

(10) Patent No.: US 6,558,755 B2
(45) Date of Patent: *May 6, 2003

(54) PLASMA CURING PROCESS FOR POROUS SILICA THIN FILM

(75) Inventors: Ivan L. Berry, III, Ellicott City, MD (US); Todd Bridgewater, Kawkawlin, MI (US); Wei Chen, Midland, MI (US); Qingyuan Han, Midland, MI (US); Eric S. Moyer, Midland, MI (US); Michael J. Spaulding, Essexville, MI (US); Carlo Waldfried, Falls Church, VA (US)

(73) Assignees: Dow Corning Corporation, Midland, MI (US); Axcelis Technologies, Inc., Beverly, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/681,332

(22) Filed: Mar. 19, 2001

(65) Prior Publication Data

US 2001/0038919 A1 Nov. 8, 2001

Related U.S. Application Data

(63) Continuation-in-part of application No. 09/528,835, filed on Mar. 20, 2000.

(51) Int. Cl.$^7$ .............................. C08J 7/18; H08H 1/24; B05D 3/02; B05D 3/06
(52) U.S. Cl. .................. 427/489; 427/536; 427/439; 427/397.7; 438/789
(58) Field of Search ................. 427/489, 436, 427/439, 397.7, 397.8; 438/789, 793

(56) References Cited

U.S. PATENT DOCUMENTS

| | | |
|---|---|---|
| 3,615,272 A | 10/1971 | Collins et al. |
| 4,636,440 A | 1/1987 | Jada |
| 4,749,631 A | 6/1988 | Haluska et al. |
| 4,756,977 A | 7/1988 | Haluska et al. |
| 4,808,653 A | 2/1989 | Haluska et al. |
| 4,822,697 A | 4/1989 | Haluska et al. |
| 4,842,888 A | 6/1989 | Haluska et al. |
| 4,847,162 A | 7/1989 | Haluska et al. |
| 4,885,186 A | 12/1989 | Bagley et al. |
| 4,905,117 A | 2/1990 | Beg |
| 4,999,397 A | 3/1991 | Weiss et al. |
| 5,008,320 A | 4/1991 | Haluska et al. |
| 5,010,159 A | 4/1991 | Bank et al. |
| 5,063,267 A | 11/1991 | Hanneman et al. |
| 5,116,637 A | 5/1992 | Baney et al. |
| 5,145,723 A | 9/1992 | Ballance et al. |
| 5,210,160 A | 5/1993 | Saive et al. |
| 5,262,201 A | 11/1993 | Chandra et al. |
| 5,290,394 A | 3/1994 | Sasaki |
| 5,416,190 A | 5/1995 | Mine et al. |
| 5,456,952 A | 10/1995 | Garza et al. |
| 5,523,163 A | 6/1996 | Ballance et al. |
| 5,547,703 A | 8/1996 | Camilletti et al. |
| 5,567,658 A | 10/1996 | Wang et al. |
| 5,618,878 A | 4/1997 | Syktich et al. |
| 5,770,260 A | 6/1998 | Fukuyama et al. |
| 5,961,851 A | 10/1999 | Kamarehi et al. |
| 6,054,206 A | 4/2000 | Mountsier |
| 6,143,360 A | 11/2000 | Zhong |
| 6,171,703 B1 | 1/2001 | Haluska |
| 6,184,260 B1 | 2/2001 | Zhong |
| 6,231,989 B1 | 5/2001 | Chung et al. |
| 6,287,990 B1 | 9/2001 | Cheung et al. |
| 6,303,192 B1 | 10/2001 | Annapragrada et al. |

FOREIGN PATENT DOCUMENTS

| | | |
|---|---|---|
| EP | 1003210 A | 5/2000 |
| JP | 09 050993 A | 2/1997 |
| WO | WO 99 21706 A | 5/1999 |

OTHER PUBLICATIONS

Liu, P.T. et al The Effect of Plasma Treats Already Cured HSQ Deposit, So Differs From These Claims, as the Plasma Does Not Cure Plasma Treatment for Low Dielectric Constant Hydrogen Silsesquioxane (HSQ), *Thin Solid Films* 332 (1998) p. 345–350, (No month).*

Glasser et al., Effect of the H20/TEOS Ration Upon the Preparation and Nitridation of Silica Sol/Gel Films; Journal of Non–Crystalline Solids; 1984; 13 pgs.; vol. 63; Elsevier Science Publishers B.V.; North–Holland, Amsterdam No month.

* cited by examiner

*Primary Examiner*—Marianne Padgett
(74) *Attorney, Agent, or Firm*—Killworth, Gottman, Hagan & Schaeff, LLP

(57) ABSTRACT

Low dielectric constant films with improved elastic modulus. The method of making such coatings involves providing a porous network coating produced from a resin containing at least 2 Si—H groups and plasma curing the coating to convert the coating into porous silica. Plasma curing of the network coating yields a coating with improved modulus, but with a higher dielectric constant. The costing is plasma cured for between about 15 and about 120 seconds at a temperature less than or about 350° C. The plasma cured coating can optionally be annealed. Rapid thermal processing (RTP) of the plasma cured coating reduces the dielectric constant of the coating while maintaining an improved elastic modulus as compared to the plasma cured porous network coating. The annealing temperature is typically loss than or about 475° C., and the annealing time is typically no more than or about 180 seconds. The annealed, plasma cured coating has a dielectric constant in the range of from about 1.1 to about 2.4 and an improved elastic modulus.

13 Claims, No Drawings

PLASMA CURING PROCESS FOR POROUS SILICA THIN FILM

CROSS REFERENCE TO RELATED APPLICATIONS

This application is a continuation-in-part of U.S. patent application Ser. No. 09/528,835, filed Mar. 20, 2000 entitled "High Modulus, Low Dielectric Constant Coatings".

BACKGROUND OF INVENTION

This invention relates generally to coatings for use in electronic devices. More particularly, the invention relates to coatings having an improved elastic modulus and a low dielectric constant and to methods of making such coatings.

Thin film dielectric coatings on electric devices are known in the art. For instance, U.S. Pat. Nos. 4,749,631 and 4,756,977, to Haluska et al., disclose silica based coatings produced by applying solutions of silicon alkoxides or hydrogen silsesquioxane, respectively, to substrates and then heating the coated substrates to a temperature between 200 and 1000° C. The dielectric constant of these coatings is often too high for certain electronic devices and circuits.

U.S. Pat. Nos. 4,847,162 and 4,842,888, to Haluska et al., teach the formation of nitrided silica coatings by heating hydrogen silsesquioxane resin and silicate esters, respectively, to a temperature between 200 and 1000° C. in the presence of ammonia. These references teach the use of anhydrous ammonia so that the resulting coating has about 1 to 2% by weight nitrogen incorporated therein.

Glasser et al., Journal of Non-Crystalline Solids, 64 (1984) pp. 209–221, teaches the formation of ceramic coatings by heating tetraethoxysilane in the presence of ammonia. This reference teaches the use of anhydrous ammonia and that the resulting silica coatings are nitrided.

U.S. Pat. No. 4,636,440, to jada, discloses a method of reducing the drying time for a sol-gel coated substrate comprising exposing the substrate to aqueous quaternary ammonium hydroxide and/or alkanol amine compounds. Jada requires that the coating be dried prior to heating. It is specifically limited to hydrolyzed or partially hydrolyzed silicon alkoxides and does not teach the utility of the process on coatings having Si—H bonds.

U.S. Pat. Nos. 5,262,201, to Chandra, and U.S. Pat. No. 5,116,637, to Baney et al., teach the use of basic catalysts to lower the temperature necessary for the conversion of various preceramic materials, all involving hydrogen silsesquioxane, to ceramic coatings. These references teach the removal of solvent before the coating is exposed to the basic catalysts.

U.S. Pat. No. 5,547,703, to Camilletti et al., teaches a method for forming low dielectric constant Si—O containing coatings on substrates comprising heating a hydrogen silsesquioxane resin successively under wet ammonia, dry ammonia, and oxygen. The resultant coatings have dielectric constants as low as 2.42 at 1 MHz. This reference teaches the removal of solvent before converting the coating to a ceramic.

U.S. Pat. No. 5,523,163, to Balance et al., teaches a method for forming Si—O containing coatings on substrates comprising heating a hydrogen silsesquioxane resin to convert it to a Si—O containing ceramic coating and then exposing the coating to an annealing atmosphere containing hydrogen gas. The resultant coatings have dielectric constants as low as 2.773. The reference teaches the removal of solvent before converting the coating to a ceramic.

U.S. Pat. No. 5,618,878, to Syktich et al., discloses coating compositions containing hydrogen silsesquioxane resin dissolved in saturated alkyl hydrocarbons useful for forming thick ceramic coatings: The alkyl hydrocarbons disclosed are those up to dodecane. The reference does not teach exposure of the coated substrates to basic catalysts before solvent removal.

U.S. Pat. No. 6,231,989 to Chung et at., entitled METHOD OF FORMING COATINGS, discloses a method of making porous network coatings with low dielectric constants. The method comprises depositing a coating on a substrate with a solution comprising a resin containing at least 2 Si—H groups and a solvent in a manner in which at least 5 volume % of the solvent remains in the coating after deposition. The costing is then exposed to an environment comprising a basic catalyst and water. Finally, the solvent is evaporated from the coating to form a porous network. If desired, the coating can be cured by heating to form a ceramic. Films made by this process have dielectric constants in the range of 1.5 to 2.4 with an elastic modulus of about 2–3 GPa.

It has now been discovered that instead of plasma treating, porous network coatings can be plasma cured, eliminating the need for prior furnace curing.

However, there remains a need for a method of making a porous network coating having an improved elastic modulus.

SUMMARY OF INVENTION

The present invention produces a coating with a low dielectric constant and an improved elastic modulus. The method of making the coating involves providing a porous network coating produced from a resin containing at least 2 Si—H groups. The coating is plasma cured to reduce the amount of Si—H bonds remaining in the coating. Plasma curing of the porous network coating yields a high elastic modulus of greater than or about 4 GPa.

The plasma cured coating can optionally be annealed. Themial annealing of the plasma cured coating reduces the dielectric constant of the coating while maintaining the increase in the elastic modulus as compared to the elastic modulus before the anneal. The annealing temperature is typically less than or about 475° C., and the annealing time is typically no more than or about 180 seconds.

The annealed, plasma cured coating has a dielectric constant in the range of from about 1.1 to about 3.5 and an elastic modulus that is generally greater than or about 4 GPa, and typically in the range of from about 4 CPa to about 10 GPa.

Accordingly, it is an object of the present invention to produce coatings having improved elastic modulus and low dielectric constant.

DETAILED DESCRIPTION

The manufacture of ultra low dielectric constant coatings having a dielectric constant of about 1.5 to about 2.4 is described in U.S. Pat. No. 6,231,989, which is incorporated herein by reference for its teaching on how to produce coatings having ultra low dIelectric constants. This patent describes a process in which pores are introduced into hydrogen silsesquloxane (HSQ) based films. HSQ based films produced according to the method taught in U.S. Pat. No. 6,231,989, which have been cured under thermal conditions, contain about 20 to about 60% Si—H bonds density. When the dielectric constant of the coating is about 2.0, the coating has an electric modulus of between about 2 and about 3 GPa. The present invention is based on the discovery that plasma cunng porous HSQ based films increases the elastic modulus of the film without the necessity of thermally curing the film. Plasma curing reduces the amount of Si—H bonds remaining without losing the low density structure of the film.

Plasma curing can generate a notable amount of polar species in the film, which can be undesirable in some applications. The present invention is also based on the discovery that applying thermal annealing to plasma cured coatings produces a low dielectric constant, improved modulus material.

The methods of the present invention are particularly applicable to the deposition of coatings on electronic devices or electronic circuits where they can serve as interlevel dielectric layers, doped dielectric layers to produce transistor like devices, pigment loaded binder systems containing silicon to produce capacitor and capacitor like devices, multilayer devices, 3-D devices, silicon on insulator devices, super lattice devices, and the like. However, the choice of substrates and devices to be coated by the instant invention is limited only by the need for thermal and chemical stability of the substrate at the temperature and pressure used in the present invention. As such, the coatings of the present invention can be used on substrates such as plastics including, for example, polyimides, epoxies, polytetrafluoroethylene and copolymers thereof, polycarbonates, acrylics and polyesters, ceramics, leather, textiles, metals, and the like.

As used in the present invention, the expression "ceramic" includes ceramics such as amorphous silica and ceramic-like materials such as amorphous silica-like materials that are not fully free of carbon and/or hydrogen but are otherwise ceramic in character. The expressions "electronic device" or "electronic circuit" include, but are not limited to, silica-based devices, gallium arsenide based devices, silicon carbide based devices, focal plane arrays, opto-electronic devices, photovoltaic cells and optical devices.

A porous network coating is needed as a starting material for the present invention. One method of making such a porous network coating is disclosed in U.S. Pat. No. 6,231,989, which is described below.

The method of producing the porous network coating starts with depositing a coating on a substrate with a solution comprising a resin containing at least 2 Si—H groups and a solvent. The resins containing at least 2 Si—H groups are not particularly limited as long as the Si—H bonds can be hydrolyzed and at least partially condensed by the basic catalyst and water to form a crosslinked network that serves as the structure for the porous network. Generally, such materials have the formula:

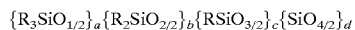
$\{R_3SiO_{1/2}\}_a\{R_2SiO_{2/2}\}_b\{RSiO_{3/2}\}_c\{SiO_{4/2}\}_d$ wherein each R is independently selected from the group consisting of hydrogen, alkyl, alkenyl, or aryl groups, or alkyl, alkenyl, or aryl groups substituted with a hetero atom such as a halogen, nitrogen, sulfur, oxygen, or silicon, and a, b, c, and d are mole fractions of the particular unit and their total is 1, with the proviso that at least 2 R groups per molecule are hydrogen and the material is sufficiently resinous in structure to form the desired network. Examples of alkyl groups are methyl, ethyl, propyl, butyl, and the like, with alkyls of 1–6 carbons being typical. Examples of alkenyl groups include vinyl, allyl, and hexenyl. Examples of aryls include phenyl. Examples of substituted groups include $CF_3(CF_2)_nCH_2CH_2$, where n=0–6.

Useful in the present invention are various hydridosiloxane resins, known as hydrogen silsesquioxane resins, comprising units of the formula $HSi(OH)_x(OR")_y O_{z/2}$. In this formula, each R" is independently selected from the group consisting of alkyl, alkenyl, or aryl groups, or alkyl, alkenyl, or aryl groups substituted with a hetero atom such as a halogen, nitrogen, sulfur, oxygen, or silicon. Examples of alkyl groups are methyl, ethyl, propyl, butyl, and the like, with alkyls of 1–6 carbons being typical. Examples of alkenyl groups include vinyl, allyl, and hexenyl. Examples of aryls include phenyl. Examples of substituted groups include $CF_3(CF_2)_nCH_2CH_2$, where n=0–6. When these R" groups are bonded to silicon through the oxygen atom, they form a hydrolyzable substituent. In the above formula, x=0 to 2, y=0 to 2, z=1 to 3, an x+y+z=3. These resins may be essentially fully condensed $(HSiO_{3/2})_n$ where n is 8 or greater, or they may be only partially hydrolyzed (i.e., containing some Si—OR"), and/or partially condensed (i.e., containing some Si—OH).

The structure of the resin containing at least 2 Si—H groups is not limited. The structure may be what is generally known as ladder-type, cage-type, or mixtures thereof. The HSQ resins may contain endgroups such as hydroxyl groups, triorganosiloxy groups, diorganohydrogensiloxy groups, trialkoxy groups, dialkoxy groups and others. The HSQ resin may also contain a small number (e.g., less than 10%) of the silicon atoms which have either 0 or 2 hydrogen atoms attached thereto and/or a small number of Si—C groups, such as $CH_3SiO_{3/2}$ or $HCH_3 SiO2/2$ groups.

The resins containing at least 2 Si—H groups and methods for their production are known in the art. For example, U.S. Pat. No. 3,615,272, to Collins, teaches the production of an essentially fully condensed hydrogen silsesquioxane resin (which may contain up to 100–300 ppm silanol) by a process comprising hydrolyzing trichlorosilane in a benzenesulfonic acid hydrate hydrolysis medium, and then washing the resulting resin with water or aqueous sulfuric acid. Similarly, U.S. Pat. No. 5,010,159 to Bank, teaches a method comprising hydrolyzing hydridosilanes in an arylsulfonic acid hydrate hydrolysis medium to form a resin which is then contacted with a neutralizing agent.

Other hydridosiloxane resins, such as those described in U.S. Pat. No. 4,999,397, to Frye, and U.S. Pat. No. 5,210,160, to Bergstrom, those produced by hydrolyzing an alkoxy or acyloxy silane in an acidic, alcoholic hydrolysis medium, those described in Japanese Kokai Patent Nos. 59-178749, 60-86017, and 63-107122, or any other equivalent hydridosiloxanes, will also function herein.

Specific molecular weight fractions of the Si—H containing resins may also be used. Such fractions and methods for their preparation are taught in U.S. Pat. No. 5,063,267, to Hanneman, and U.S. Pat. No. 5,416,190, to Mine. A typical fraction comprises material wherein at least 75% of the polymeric species have a number average molecular weight above about 1200, and a more typical fraction comprises material wherein at least 75% of the polymeric species have a number average molecular weight between about 1200 and about 100,000.

The Si—H containing resins may contain other components as long as these components do not interfere with the integrity of the coating. It should be noted, however, that certain materials may increase the dielectric constant of the coating.

Ceramic oxide precursors may also be used in combination with the Si—H containing resins. The ceramic oxide precursors useful herein include compounds of various metals such as aluminum, titanium, zirconium, tantalum, niobium and/or vanadium, as well as various non-metallic compounds, such as those of boron or phosphorus, which may be dissolved in solution, hydrolyzed and subsequently pyrolyzed at relatively low temperature to form ceramic oxides. Ceramic oxide precursors useful herein are described in U.S. Pat. Nos. 4,808,653, 5,008,320, and 5,290,394.

The Si—H containing resins are applied to the substrates as solvent dispersions to form a coating on the substrate ("SiH resin coating"). Solvents that may be used include any agent or mixture of agents that will dissolve or disperse the resin to form a homogeneous liquid mixture without affecting the resulting coating or the substrate. These solvents can include alcohols, such as ethyl alcohol or isopropyl alcohol; aromatic hydrocarbons, such as benzene or toluene; branched or linear alkanes, such as n-heptane, dodecane, or nonane; branched or linear alkenes, such as n-heptene, dodecene or tetradecene; ketones, such as methyl isobutyl ketone; esters; ethers, such as glycol ethers; or linear or cyclic siloxanes, such as hexamethyldisiloxane, octamethyidisiloxane, and mixtures thereof, or cyclic dimethylpolysiloxanes; or mixtures of any of the above solvents. The solvent is generally present in an amount sufficient to dissolve/disperse the resin to the concentration desired for application. Typically, the solvent is present in an amount of about 20 to about 99.9 wt %, and more typically from about 70 to about 95 wt %, based on the weight of the resin and solvent.

If desired, other materials can be included in the resin dispersion. For instance, the dispersion can include fillers, colorants, adhesion promoters, and the like.

Specific methods for application of the resin dispersion to the substrate include, but are not limited to, spin coating, dip coating, spray coating, flow coating, screen printing, or others. A typical method is spin coating.

At least about 5 volume % of the solvent should remain in the SiH resin coating until the resin is contacted with the basic catalyst and water. This solvent forms the pores of the porous network coating as the Si—H bonds are hydrolyzed and condensed. In some embodiments, it may be typical that at least about 10 volume % solvent remains, while in others, it may be typical that at least about 15 volume % solvent remains, and in still others, it may be typical that at least about 25 volume % solvent remains.

The method of retaining the solvent is not particularly restricted. In a typical embodiment, a high boiling point solvent can be used alone or as a co-solvent with one of the solvents described above. In this manner, processing the resin dispersion as described above under normal conditions allows for at least about 5% residual solvent remaining. Typical high boiling solvents in this embodiment are those with boiling points above about 175° C. including hydrocarbons, aromatic hydrocarbons, esters, ethers, and the like. Examples of specific solvents which can be used in this embodiment include saturated hydrocarbons, such as dodecane, tetradecane, hexadecane, etc., unsaturated hydrocarbons such as dodecene, tetradecene, etc., xylenes, mesitylene, 1-heptanol, dipentene, d-limonene, tetrahydrofurfuryl alcohol, mineral spirits, 2-octanol, stoddard solvent, Isopar H™, diethyl oxalate, diamyl ether, tetrahydropyran-2-methanol, lactic acid butyl ester, isooctyl alcohol, propylene glycol, dipropylene glycol monomethyl ether, diethylene glycol diethyl ether, dimethyl sulfoxide, 2,5-hexanedione, 2 -butoxyethanol acetate, diethylene glycol monomethyl ether, 1-octanol, ethylene glycol, Isopar L™, dipropylene glycol monomethyl ether acetate, diethylene glycol monoethyl ether, N-methylpyrrolidone, ethylene glycol dibutyl ether, gamma-butyrolactone, 1,3-butanediol, diethylene glycol monomethyl ether acetate, trimethylene glycol, triethylene glycol dimethyl ether, diethylene glycol monoethyl ether acetate, alpha-terpineol, n-hexyl ether, kerosene, 2-(2-n-butoxyethoxy) ethanol, dibutyl oxalate, propylene carbonate, propylene glycol monophenyl ether, diethylene glycol, catechol, diethylene glycol monobutyl ether acetate, ethylene glycol monophenyl ether, diethylene glycol dibutyl ether, diphenyl ether, ethylene glycol monobenzyl ether, hydroquinone, sulfolane, and triethylene glycol. Hydrocarbon solvents are particularly preferred.

The above processing (i.e., primarily deposition of the SiH resin coating solution) can be done in an environment that inhibits solvent evaporation prior to contact with the basic catalyst and water. For example, the spin coating can be performed in a closed environment such that the subsequent steps (i.e., contact with the basic catalyst and water) can occur before the solvent is completely evaporated.

The SiH resin coating containing at least about 5 volume % solvent is then contacted with a basic catalyst and water. Examples of basic catalysts include ammonia, ammonium hydroxide, as well as amines. The amines useful herein may include primary amines ($RNH_2$), secondary amines ($R_2NH$), and/or tertiary amines ($R_3N$) in which R is independently a saturated or unsaturated aliphatic, such as methyl, ethyl, propyl, vinyl, allyl, ethynyl, etc.; an alicyclic, such as cyclohexylmethyl; an aromatic, such as phenyl; a substituted hetero atom, such as oxygen, nitrogen, sulfur, etc.; or compounds in which the nitrogen atom is a member of a heterocyclic ring such as quinoline, pyrrolidine, or pyridine. In addition, any of the above amine compounds may be substituted with other hydrocarbon and/or hetero containing groups to form compounds such as diamines, amides, etc. Finally, it is also contemplated that compounds, which are converted to amines under the reactions conditions used, would function in an equivalent manner. For example, a compound such as an ammonium salt that yields an amine upon dissolution would provide the desired catalytic effect.

Examples of the amines that may used herein include methylamine, ethylamine, butylamine, allylamine, cyclohexylamine, aniline, dimethylamine, diethylamide, dioctylamine, dibutylamine, methylethylamine, saccharin, piperidine, trimethylamine, triethylamine, pyridine, diethyl toluidene ethylmethylpropylamine, imidazole, choline acetate, triphenyl phosphene analine, trimethylsilylimidazole, ethylened iamine, diethylhydroxylamine, triethylenediamine, n-methylpyrolidone, etc.

The basic catalyst can generally be used at any concentration sufficient to catalyze hydrolysis of the Si—H bonds. Generally, concentrations of the basic catalyst can be from about 1 ppm to about 100 wt % based on the weight of the resin, depending on the basic catalyst.

The water used can be that present in the ambient environment (e.g., >about 25% relative humidity), the ambient environment can be supplemented with additional water vapor (e.g., relative humidity up to about 100%), water can be used as a liquid, or a compound which generates water under the reaction conditions can be used.

Contact of the SiH resin coating with the basic catalyst and water can be accomplished by any means practical or desirable. For instance, the SiH resin coating can be contacted with vapors of the basic catalyst and water vapor. Alternatively, the SiH resin coating can be contacted with the basic catalyst and water in the liquid state, such as by immersing the coating in an ammonium hydroxide solution.

The SiH resin coating is typically exposed to an environment comprising the basic catalyst and water in the vapor state, more typically ammonia and water vapor. For instance, the SiH resin coated substrate may be placed in a container and the appropriate environment introduced therein, or a stream of the basic catalyst and water may be directed at the SiH resin coating.

The method used to generate the basic catalyst and water environment is generally not significant in the present embodiment. Methods such as bubbling the basic catalyst (e.g., ammonia gas) through water or ammonium hydroxide solutions (to control the amount of water vapor present), heating a basic catalyst and water, or heating water and introducing the basic catalyst gas (e.g., ammonia gas) are all functional herein. It is also contemplated that methods, which generate basic catalyst vapors in situ, such as the addition of water to amine salts, or the addition of water to a silazane such as hexamethyldisilazane, will also be effective.

The basic catalyst used may be at any concentration desired. For example, the concentration may be from about 1 ppm up to a saturated atmosphere.

The exposure can be at any temperature desired from room temperature up to about 300° C. A temperature in the range of from about 20° C. to about 200° C. is typical, with a range of from about 20° C. to about 100° C being more typical.

The SiH resin coating should be exposed to the basic catalyst and water environment for the time necessary to hydrolyze the Si—H groups to form silanols (Si—OH) and for the silanols to at least partially condense to form Si—O—Si bonds. Generally, exposures of up to about 20 minutes are typical, with exposures of at least about 1 second up to about 5 minutes being more typical. If the coatings are to be used as a dielectric layer, it is generally typical to have a shorter exposure, as longer exposures tend to increase the dielectric constant of the coating.

When the coating is exposed to the basic catalyst and water in the liquid state, the exposure is usually conducted by immersing the coated substrate in a solution. Other equivalent methods can be used, such as flushing the coating with a basic catalyst and water solution. In addition, vacuum infiltration may also be used to increase penetration of the basic catalyst and water into the coating.

The basic catalyst solution used in this embodiment may be at any concentration desired. Generally when ammonium hydroxide is used, a concentrated aqueous solution of between about 28 and about 30% is typical since the duration of exposure is thereby shortened. When dilute solutions are used, the diluent is generally water.

Exposure to the basic catalyst and water solution in this embodiment may be conducted at any temperature and pressure desired. Temperatures from about room temperature (20–30° C.) up to about the boiling point of the basic catalyst solution, and pressures from below to above atmospheric are all contemplated herein. From a practical standpoint, it is typical that the exposure occur at about room temperature and at about atmospheric pressure.

The resin coating is exposed to the basic catalyst solution in this embodiment for the time necessary to hydrolyze the Si—H groups to form silanols (Si—OH) and for the silanols to at least partially condense to form Si—O—Si bonds. Generally, exposures of up to about 2 hours are typical, with exposures of at least about 1 second up to about 15 minutes being more typical.

Alternatively, the coating may be exposed to both a liquid basic catalyst and water environment (e.g., ammonium hydroxide) and a gaseous basic catalyst and water vapor environment (ammonia gas and water vapor). The exposures may be either sequential or simultaneous, and are generally under the same conditions as those described above.

After the resin is exposed to one of the above environments, the solvent is then removed from the coating. This can be accomplished by any desired means, including but not limited to, heating the coating, and by vacuum. When the solvent is removed by heating the coating, condensation of the remaining silanols may be facilitated.

The coating produced by this process can be used as the starting material ("porous network coating") in the present invention. In a typical procedure to produce a porous network coating, a substrate is coated with the Si—H containing resin and solvent in a manner which ensures that at least about 5 volume % of the solvent remains in the coating. The coating is then exposed to the basic catalyst and water, and the solvent is evaporated.

Another method of making such a porous network coating is disclosed in U.S. Pat. No. 6,143,360 to Zhong, entitled METHOD FOR MAKING NANOPOROUS SILICONE RESINS FROM ALKYLHYDRIDOSILOXANE RESINS. The method comprises contacting a hydridosilicon containing resin with a 1-alkene comprising about 8 to about 28 carbon atoms in the presence of a platinum group metal-containing hydrosilation catalyst, effecting formation of an alkylhydridosiloxane resin where at least about 5 percent of the silicon atoms are substituted with at least one hydrogen atom and heating the alkylhydridosiloxane prepared at a temperature sufficient to effect curing and thermolysis of alkyl groups from the silicon atoms, thereby forming a nanoporous silicone resin.

Although porous network coatings having low dielectric constants are desirable, it would be advantageous to have a coating with a higher elastic modulus.

In order to raise the elastic modulus of the porous network coating, it is exposed to a plasma cure. The plasma cure can be done by radio frequency (RF), inductive coupled, RF capacitive coupled, helical resinator, microwave downstream, and microwave electron cyclotron resonance (ECR) plasma.

In a typical plasma curing process, the wafer is quickly heated in a rapid temperature ramp-up step to the desired temperature, and the wafer is plasma cured.

The exact conditions for the plasma cure depend upon what type of plasma cure is being used. Examples of typical microwave plasma cure conditions for a 200 mm wafer are shown below.

Microwave Plasma Power:1000 W–2000 W
Wafer Temperature:80° C.–350° C.
Process Pressure:1.0 torr–6.0 torr
Plasma Cure Time:>15 seconds
Plasma Gases:$H_2/N_2/CF_4/O_2$
$O_2$ flow rate:0–4000 sccm
$CF_4$ flow rate:0–400 sccm $H_2/N_2$ Gas Mixture flow rate:>0–4000 sccm The plasma cured porous network coatings of the present invention have improved chemical stability and improved dimensional stability. By improved chemical stability, we mean that the coatings are more resistant to chemicals, such as cleaning solutions and chemical polishing solutions, and plasma damaging during photoresist ashing and dry etching processes.

However, plasma cure can generate a notable amount of polar species in the film.

The plasma cured coatings can be annealed using any type of thermal exposure to reduce the dielectric constant, if desired. For example, the plasma cured coatings can be placed in a conventional oven until the polar species are removed, such as at 450° C. for 30 minutes. Another process which can be used involves annealing the plasma cured coatings in a Rapid Thermal Processing (RTP) chamber in order to reduce the dielectric constant. The plasma cured coating is annealed at a typical temperature for a sufficient time, and cooled to about 100° C.

Typical operating conditions for the RTP process are shown below.
Ramp rate:150° C./sec
Wafer Temperature:350–450° C.
Annealing Time:<180 seconds The dielectric constant of the annealed, plasma cured coatings is reduced as compared to the plasma cured porous network coatings. The dielectric constant of the annealed, plasma cured coatings is typically in the range of from about 1.1 to about 3.5 and more typically in the range of from about 2 to about 2.5.

The elastic modulus of the annealed, plasma cured coating is increased as compared to a furnace (thermally) cured The plasma conditions were 2–4 torr in pressure. The temperatures were controlled between 195–230° C. The forming gas was $N_2/H_2/CF_4$. The plasma power and gas flow data are listed in Table 1.

The results indicate that, after plasma curing, the dielectric constants are in a range of 2.0 to 2.8. The plasma conditions at 210° C. yielded films of lower dielectric constants, lower than 2.4. The films processed at 195, 225, and 230° C. showed dielectric constants higher than 2.4. The modulus of the plasma cured films are from 6 to 9 GPa. The plasma curing process took off approximately 10% of the film thickness. However, the uniformity of the plasma cured film is typically within 2%. The FTIR spectra suggest that Si—H bonds were completely removed from the films during the plasma curing at pressures of 2–3 torr, implying that porous silica films were made from the plasma curing process. Typically, the films with the dielectric constants of 2.0–2.3 include less than 1% Si—OH.

TABLE 1

Plasma Cure of Films (Example 1)

| | Pre-Plasma Heating | | | Plasma Cure Conditions | | | | | | | | | |
|---|---|---|---|---|---|---|---|---|---|---|---|---|---|
| Wafer | Time (sec) | Pressure (torr) | Temperature (° C.) | Time (sec) | Pressure (torr) | Temperature (° C.) | Power (W) | $H_2N_2$ (sccm) | $CF_4$ (sccm) | DK | Modulus (GPa) | Refractive Index | Thickness (Å) |
| 1 | 120 | 2.0 | 210 | 90 | 2.0 | 210 | 1800 | 2000 | 100 | 2.30 | 7.3 | 1.202 | 4302 |
| 2 | 120 | 3.0 | 210 | 90 | 3.0 | 210 | 1800 | 2000 | 100 | 2.13 | 7.0 | 1.196 | 4265 |
| 3 | 120 | 3.0 | 210 | 90 | 3.0 | 210 | 1800 | 2000 | 100 | 2.27 | 8.2 | 1.258 | 3628 |
| 4 | 120 | 2.5 | 210 | 90 | 2.5 | 210 | 1800 | 2000 | 100 | 2.29 | 7.9 | 1.247 | 3671 |
| 5 | 120 | 4.0 | 210 | 90 | 4.0 | 210 | 1800 | 2000 | 100 | 2.16 | 6.7 | 1.205 | 3676 |
| 6 | 120 | 4.0 | 210 | 90 | 4.0 | 210 | 1800 | 2000 | 100 | 2.24 | 6.5 | 1.182 | 4403 |
| 7 | 120 | 2.5 | 230 | 90 | 2.5 | 230 | 1800 | 2000 | 100 | 2.80 | 8.8 | 1.244 | 3652 |
| 8 | 120 | 2.0 | 225 | 90 | 2.0 | 225 | 1800 | 2000 | 100 | 2.88 | 7.6 | 1.203 | 4442 |
| 9 | 120 | 2.5 | 225 | 90 | 2.5 | 225 | 1800 | 2000 | 100 | 2.57 | 7.2 | 1.212 | 4315 |
| 10 | 120 | 3.0 | 225 | 90 | 3.0 | 225 | 1800 | 2000 | 100 | 2.43 | 7.2 | 1.197 | 4400 |
| 11 | 120 | 2.0 | 195 | 90 | 2.0 | 195 | 1800 | 2000 | 100 | 2.59 | 6.8 | 1.215 | 4351 |
| 12 | 120 | 2.5 | 195 | 90 | 2.5 | 195 | 1800 | 2000 | 100 | 2.74 | 7.3 | 1.216 | 4315 |
| 13 | 120 | 3.0 | 195 | 90 | 3.0 | 195 | 1800 | 2000 | 100 | 2.73 | 7.0 | 1.203 | 4296 |
| 14 | 0 | 2.5 | 210 | 90 | 2.5 | 210 | 1800 | 2000 | 100 | 2.10 | 6.9 | 1.216 | 3733 |
| 15 | 0 | 3.0 | 210 | 90 | 3.0 | 210 | 1800 | 2000 | 100 | 2.02 | 6.6 | 1.212 | 3766 | coating which would have an elastic modulus of between about 2.0 and about 3.0 when the dielectric constant is about 2.0. This increase in the elastic modulus is typically greater than or about 50%, and more typically greater than or about 100%. Typically, the elastic modulus of the annealed, plasma cured coating is greater than or about 4 GPa, and more typically between about 4 GPa and about 10 GPa.

In order that the invention may be more readily understood, reference is made to the following examples, which are intended to illustrate the invention, but not limit the scope thereof.

EXAMPLE 1

Porous network coatings were produced from hydrogen silsesquioxane resin by spinning onto silicon wafers and treating with $NH_3$ followed by 1 minute 150° C. hotplate thermal treatments. The plasma conversion was done in an Axcelis Fusion Gemini® ES plasma asher. After the plasma conversion, porous silica films with low dielectric constant and high modulus have been obtained. The results are shown in Table 1.

EXAMPLE 2

Porous network coatings were produced from hydrogen silsesquioxane by spinning onto silicon wafers and treating with $NH_3$ followed by 1 minute 150° C. hotplate thermal treatments. The $NH_3$ aging time was ½ to ⅔ of standard recipes specified in both the TEL spin tool and the DNS spin tool. The plasma conversion was done in an Axcelis Fusion Gemini® ES plasma asher. After the plasma conversion, porous silica films with low dielectric constant and high modulus have been obtained. The results are shown in Table 2.

The plasma conditions were 2–4 torr in pressure. The temperatures were controlled at 210° C. The forming gas was $N_2/H_2/CF_4$. The plasma power and gas flow data are listed in Table 2.

The plasma curing can also convert the initial films into porous silica films even if the initial films were aged for a short time under moist $NH_3$. The plasma cured films with less than standard aging time show dielectric constants under 2.3. The modulus values are from 5.7 to 9 GPa. Again, from FTIR spectra, Si—H bonds were removed during the plasma curing so that porous silica films were obtained. The Si—OH level in these films is typically less than 1%.

TABLE 2

Plasma Cure of Films (Example 2)

| | Pre-Plasma Heating | | | Plasma Cure Conditions | | | | | | | | | |
|---|---|---|---|---|---|---|---|---|---|---|---|---|---|
| Wafer | Time (sec) | Pressure (torr) | Temperature (° C.) | Time (sec) | Pressure (torr) | Temperature (° C.) | Power (W) | $H_2N_2$ (sccm) | $CF_4$ (sccm) | DK | Modulus (GPa) | Refractive Index | Thickness (Å) |
| | | | | | 2/3 $NH_3$ Treatment in TEL | | | | | | | | |
| 1 | 120 | 3.0 | 210 | 90 | 3.0 | 210 | 1800 | 2000 | 100 | 2.60 | 8.8 | 1.258 | 3521 |
| 2 | 120 | 2.5 | 210 | 90 | 2.5 | 210 | 1800 | 2000 | 100 | 2.32 | 9.0 | 1.261 | 3577 |
| 3 | 120 | 2.5 | 210 | 90 | 2.5 | 210 | 1800 | 2000 | 100 | 2.27 | 8.2 | 1.258 | 3628 |
| 4 | 120 | 4.0 | 210 | 90 | 4.0 | 210 | 1800 | 2000 | 100 | 2.23 | 5.7 | 1.214 | 3570 |
| 5 | 120 | 2.5 | 230 | 90 | 2.5 | 230 | 1800 | 2000 | 100 | 2.24 | 8.5 | 1.257 | 3654 |
| 6 | 60 | 2.5 | 210 | 90 | 2.5 | 210 | 1800 | 2000 | 100 | 2.21 | 9.1 | 1.254 | 4599 |
| 7 | 0 | 2.5 | 210 | 90 | 2.5 | 210 | 1800 | 2000 | 100 | 2.24 | 9.0 | 1.270 | 3550 |
| | | | | | 1/2 $NH_3$ Treatment in DNS | | | | | | | | |
| 8 | 120 | 2.5 | 210 | 90 | 2.5 | 210 | 1800 | 2000 | 100 | 2.27 | 8.4 | 1.219 | 4269 |
| 9 | 120 | 3.0 | 210 | 90 | 3.0 | 210 | 1800 | 2000 | 100 | 2.39 | 8.0 | 1.218 | 4186 |

EXAMPLE 3

Porous network coatings were produced from hydrogen silsesquioxane by spinning onto silicon wafers and treating with excessive $NH_3$ followed by 1 minute 150° C. hotplate thermal treatments. The $NH_3$ aging time was twice as long as that specified in the standard recipes for both the TEL spin tool and the DNS spin tool. The plasma conversion was done in an Axcelis Fusion Gemini® ES plasma asher. The results are shown in Tables 3A and 3B.

The plasma conditions were 2.5–3 torr in pressure. The temperatures were controlled at 210° C. The forming gas was $N_2/H_2/CF_4$. The plasma power and gas flow data are listed in Tables 3A and 3B.

After longer $NH_3$ aging, the dielectric constants of the plasma cured porous films are 2.5 or higher, and the moduli are approximately 7–8 GPa. The Si—OH content is typically around 1.5–2.5%, as calculated from FTIR spectra. The Si—H bonds were completely removed.

In Examples 1–3, the infrared spectra of the annealed, plasma cured coatings that were thermally annealed by heating using RTP are virtually identical to those coatings that were thermally annealed by other heating methods. The features in the spectra indicate that this plasma cured film is silica in nature. The SiOH content is less than 1 weight percent as calculated from the infrared spectra. The refractive index (RI) of the RTP annealed coatings (1.20 to 1.22) is consistent with the RI value of coatings that were thermally annealed by other heating methods. The elastic modulus of the plasma cured coatings that were thermally annealed by RTP can be two or three times higher (as high as 7–8 GPa) than the initial elastic modulus. The dielectric constants of these coatings range from 2.1 to 2.3.

TABLE 3A

Long Aging Time 2x Standard Time on the DNS Tool (Example 3)

| | Pre-Plasma Heating | | | Plasma Cure Conditions | | | | | | | | | |
|---|---|---|---|---|---|---|---|---|---|---|---|---|---|
| Wafer | Time (sec) | Pressure (torr) | Temperature (° C.) | Time (sec) | Pressure (torr) | Temperature (° C.) | Power (W) | $H_2N_2$ (sccm) | $CF_4$ (sccm) | DK | Modulus (GPa) | Refractive Index | Thickness (Å) |
| 1 | 120 | 3.0 | 210 | 90 | 3.0 | 210 | 1800 | 2000 | 100 | 2.63 | 8.0 | 1.197 | 4369 |
| 2 | 120 | 2.5 | 210 | 90 | 2.5 | 210 | 1800 | 2000 | 100 | 2.53 | 8.2 | 1.197 | 4685 |

TABLE 3B

Long Aging Time 1.5x Standard Time on the DNS Tool (Example 3)

| | Pre-Plasma Heating | | | Plasma Cure Conditions | | | | | | | | | |
|---|---|---|---|---|---|---|---|---|---|---|---|---|---|
| Wafer | Time (sec) | Pressure (torr) | Temperature (° C.) | Time (sec) | Pressure (torr) | Temperature (° C.) | Power (W) | $H_2N_2$ (sccm) | $CF_4$ (sccm) | DK | Modulus (GPa) | Refractive Index | Thickness (Å) |
| 3 | 120 | 3.0 | 210 | 90 | 3.0 | 210 | 1800 | 2000 | 100 | 2.54 | 8.4 | 1.200 | 4429 |
| 4 | 120 | 2.5 | 210 | 90 | 2.5 | 210 | 1800 | 2000 | 100 | 2.53 | 8.7 | 1.199 | 4454 |

By the above methods, a thin (less than 5 microns) $SiO_2$ containing coating is produced on the substrate. The coating has an improved elastic modulus. Furthermore, with the annealing step, the coating can have an improved elastic modulus and a low dielectric constant.

The coating smooths the irregular surfaces of various substrates and has excellent adhesion. In addition, the coating may be covered by other coatings, such as further $SiO_2$ coatings, $SiO_2$/modifying ceramic oxide layers, silicon containing coatings, carbon containing coatings, and/or diamond like coatings.

These coatings posses low defect density and are useful on electronic devices as dielectric layers in, for example, multilayer devices.

While certain representative embodiments and details have been shown for purposes of illustrating the invention, it will be apparent to those skilled in the art that various changes in the compositions and methods disclosed herein may be made without departing from the scope of the invention, which is defined in the appended claims.

What is claimed is:

1. A method of making a plasma cured coating comprising:

providing a porous network coating produced from a resin molecule containing at least 2 Si—H groups; and plasma curing the porous network coating to reduce an amount of Si—H bonds and to produce an $SiO_2$—containlng plasma cured coating having a first dielectric constant and having a first elastic modulus.

2. The method of claim 1 wherein the porous network coating is plasma cured for a time in the range of about 15 to about 120 seconds.

3. The method of claim 1 wherein the porous network coating is plasma cured at a temperature less than or about 350° C.

4. The method of claim 1 wherein the porous network coating is plasma cured at a temperature in the range of about 80° C. to about 280° C.

5. The method of claim 1 wherein the porous network coating is plasma cured at a temperature in the range of about 195° C. to about 230° C.

6. The method of claim 1 further comprising annealing the plasma cured coating to provide an annealed, plasma cured coating having a second dielectric constant which is less than the first dielectric constant and having a second elastic modulus which is comparable to the first elastic modulus.

7. The method of claim 6 wherein the plasma cured coating is annealed at a temperature less than or about 475° C.

8. The method of claim 6 wherein the plasma cured coating is annealed at a temperature in the range of about 350° C. to about 450° C.

9. The method of claim 6 wherein the plasma cured coating is annealed for no more than or about 180 seconds.

10. The method of claim 6 wherein the second elastic modulus of the annealed, plasma cured coatIng is greater than or about 4 GPa.

11. The method of claim 6 wherein the second elastic modulus of the annealed, plasma cured coating is between about 4 GPa and about 10 GPa.

12. The method of claim 6 wherein the second dielectric constant of the annealed, plasma cured coating is in the range of from about 1.1 to about 3.5.

13. The method of claim 6 wherein the second dielectric constant of the annealed, plasma cured coating is in the range of from about 2 to about 2.5.

* * * * *